(12) United States Patent
Saito

(10) Patent No.: US 6,417,050 B1
(45) Date of Patent: Jul. 9, 2002

(54) SEMICONDUCTOR COMPONENT AND METHOD OF MANUFACTURE

(75) Inventor: Yoshinori Saito, Miyagi (JP)

(73) Assignee: Semiconductor Components Industries LLC, Phoenix, AZ (US)

( * ) Notice: Subject to any disclaimer, the term of this patent is extended or adjusted under 35 U.S.C. 154(b) by 11 days.

(21) Appl. No.: 09/636,646

(22) Filed: Aug. 7, 2000

(51) Int. Cl.[7] .................. H01L 21/336; H01L 21/76
(52) U.S. Cl. ................ 438/270; 438/271; 438/272; 438/425; 438/426; 438/429; 438/433
(58) Field of Search ................ 438/270, 271, 438/272, 429, 425, 426, 433

(56) References Cited

U.S. PATENT DOCUMENTS 5,293,053 A * 3/1994 Malhi et al. ............. 257/330
5,923,980 A * 7/1999 Gardner et al. ............ 438/270
5,998,267 A * 12/1999 Bergemont et al. ........ 438/270
6,010,930 A * 1/2000 Keller et al. .............. 438/238
6,077,744 A * 6/2000 Hao et al. ................. 438/268
6,100,146 A * 8/2000 Gardner et al. ............ 438/301
6,191,446 B1 * 2/2001 Gardner et al. ............ 257/330
6,225,161 B1 * 5/2001 Liu et al. .................. 438/259

* cited by examiner

Primary Examiner—John F. Niebling
Assistant Examiner—Viktor Simkovic

(57) ABSTRACT

A method of manufacturing a semiconductor component includes disposing a layer (120) of an electrically insulative material over a semiconductor substrate (110), etching a trench (310) into the layer and the semiconductor substrate, disposing a layer (410) of a semiconductor material in the trench, and forming a gate contact (1410) in the trench.

7 Claims, 6 Drawing Sheets

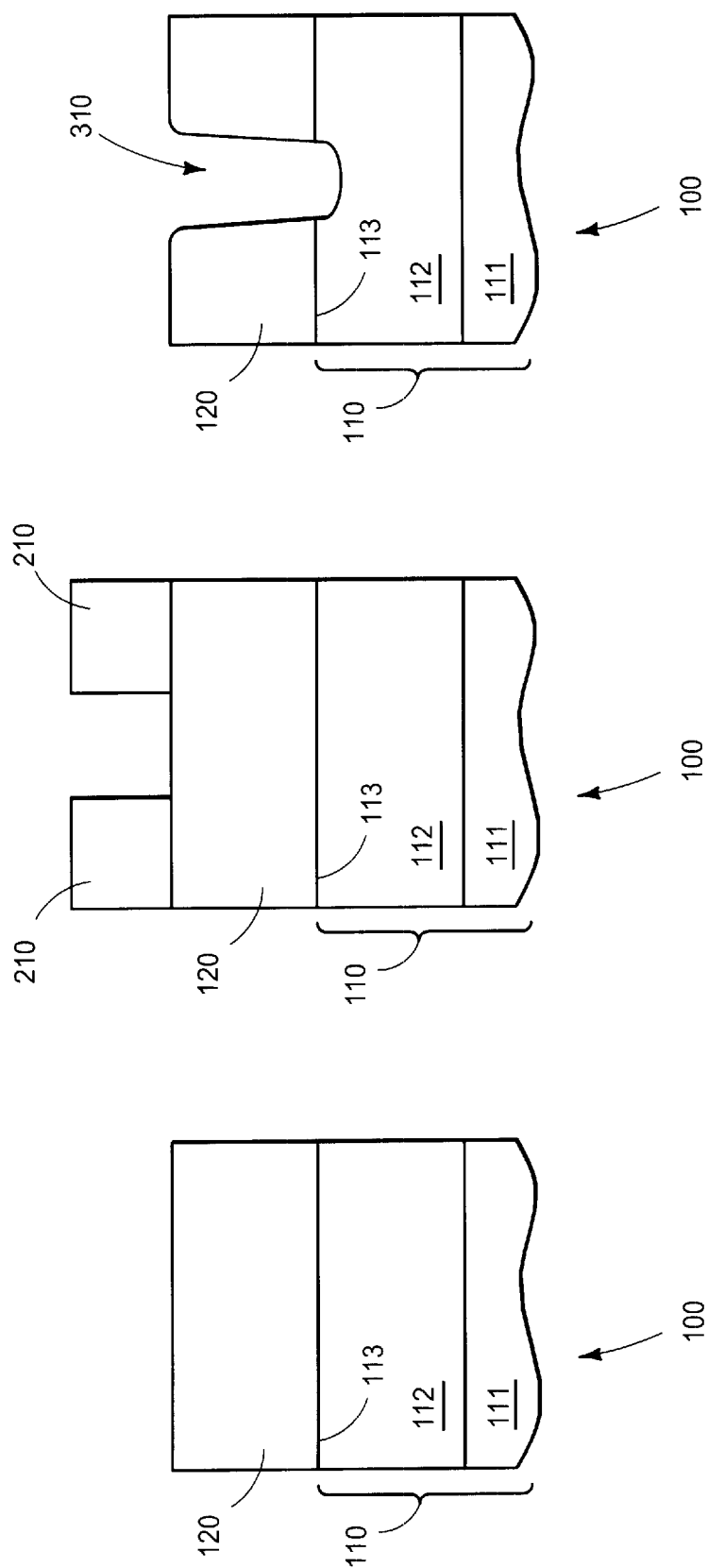

SEMICONDUCTOR COMPONENT AND METHOD OF MANUFACTURE

FIELD OF THE INVENTION

This invention relates, in general, to electronics, and more particularly, to semiconductor components and methods of manufacture.

BACKGROUND OF THE INVENTION

Semiconductor components include integrated circuits, discrete power transistors, and combinations thereof. One type of discrete power transistor is known as a trench power Metal-Oxide-Semiconductor Field Effect Transistor (MOSFET), which is a vertical transistor with a gate electrode located in a trench that is etched into a semiconductor substrate. However, trench power MOSFETs have a channel structure that poorly controls source-drain punch-through and cannot achieve high insulation voltage resistance. To reduce the magnitude of these deficiencies, the size of these trench power MOSFETs is increased, which produces a low cell density.

Another type of discrete power transistor is known as a V-MOSFET. A V-MOSFET is similar to a trench power MOSFET, except that the trench of the V-MOSFET has the shape of a "V". However, V-MOSFETs also have low cell densities and can neither achieve high insulation voltage resistance nor adequately control source-drain punch-through.

Accordingly, a need exists for a semiconductor component having high cell density, high voltage resistance, and adequate control of source-drain punch-through.

BRIEF DESCRIPTION OF THE DRAWINGS

The invention will be better understood from a reading of the following detailed description, taken in conjunction with the accompanying drawing figures in which:

FIGS. 1 through 15 illustrate cross-sectional views of a portion of a semiconductor component after different steps of a manufacturing process in accordance with an embodiment of the invention.

Figure 6:
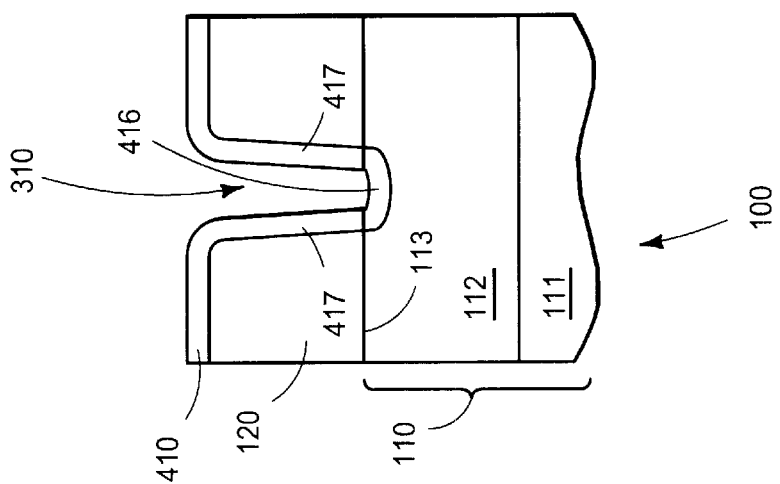

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, third, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in other sequences than described or illustrated herein.

Moreover, the terms top, bottom, over, under, and the like in the description and in the claims, if any, are used for descriptive purposes and not necessarily for describing relative positions. It is understood that the terms so used are interchangeable under appropriate circumstances and that the embodiments of the invention described herein can exist in other orientations than described or illustrated herein.

DETAIL DESCRIPTION OF THE DRAWINGS

FIGS. 1 through 15 illustrate cross-sectional views of a portion of a semiconductor component 100 after different steps of a manufacturing process. Component 100 can comprise a power MOSFET and can also comprise an integrated circuit. In the preferred embodiment, component 100 consists only of a discrete vertically insulated power MOSFET.

In FIG. 1, component 100 is illustrated to include a semiconductor substrate 110 having a surface 113. In the preferred embodiment, substrate 110 comprises a support layer 111 and an epitaxial layer 112. Layer 111 has a first conductivity type and a first doping concentration. As an example, the first conductivity type can be an n-type conductivity. Layer 112 overlies layer 111 and also has the first conductivity type. However, layer 112 has a second doping concentration that is less than the first doping concentration of layer 111. As an example, layer 112 can have an N− conductivity type, and layer 111 can have an N+ conductivity type. Both layers 111 and 112 can be comprised of silicon. Layer 112 forms surface 113 of substrate 110, and layer 111 serves as a drain region for component 100.

A first layer 120 is disposed or formed over surface 113 of substrate 110. As an example, layer 120 can be comprised of an electrically insulative material and can have a thickness of approximately 200 to 2,000 nanometers. The thickness of layer 120 defines the gate length of the MOSFET in component 100. Gate length control is more precise and easier for the MOSFET in component 100 because of vertical structure of the MOSFET as compared to conventional planar MOSFETs.

In the preferred embodiment, layer 120 is comprised of silicon dioxide that is thermally grown on surface 113 of substrate 110. As an example, layer 112 can be oxidized to form layer 120. In an alternative embodiment, layer 120 can be comprised of a different electrically insulative material such silicon nitride or a semiconductor material such as silicon.

Turning to FIG. 2, an etch mask 210 is formed over layer 120. As an example, mask 210 can be comprised of photoresist. Mask 210 exposes a portion of layer 120 and defines a trench to be etched sequentially into layers 120 and 112.

In FIG. 3, a trench 310 has been etched into layers 120 and 112. In the preferred embodiment, mask 210 (FIG. 1) defines trench 310 in layer 120, and then mask 210 is removed. Subsequently, layer 120 is used as a self-aligned etch mask for etching trench 310 into layer 112. The process of forming trench 310 into layer 112 damages the exposed surface of layer 112 that defines trench 310. However, the exposed surface of layer 112 is used as a seed crystal over which an epitaxial or crystalline layer is subsequently formed. Therefore, this damaged surface of layer 112 is removed by using a down-flow plasma clean or a wet clean to expose an undamaged and crystalline portion of layer 112. In the preferred embodiment, trench 310 is prevented from extending into layer 111.

Further in the preferred embodiment, the process for forming trench 310 does not begin until after layer 120 is formed. In an alternative embodiment, the portion of trench 310 located in layer 112 can be formed prior to the formation of layer 120.

Figure 4:
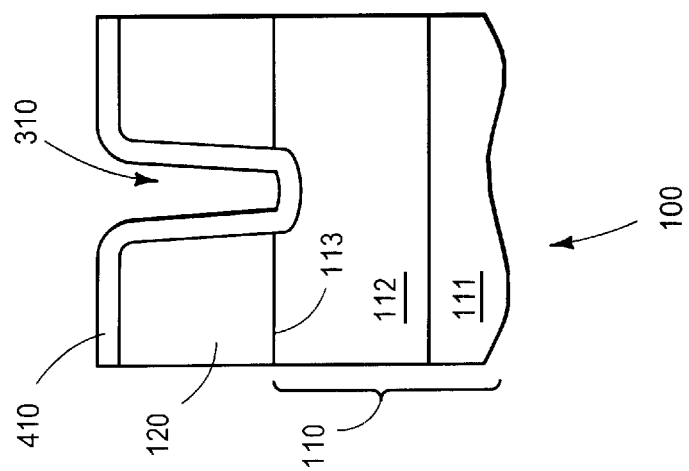

Turning to FIG. 4, a second layer 410 is disposed, formed, or deposited over substrate 110. Layer 410 is comprised of a semiconductor material such as, for example, silicon. Layer 410 is located over layer 120, over layer 112, and in trench 310. In the preferred embodiment, layer 410 is deposited on layers 120 and 112. Layer 410 is an electrically conductive layer. In the preferred embodiment, layer 410 has a second conductivity type and has a third doping concentration that is less than the first doping concentration of layer 111. Furthermore, layer 410 can have a thickness of approximately 20 to 250 nanometers. As an example, the second conductivity type can be a p-type conductivity.

In the preferred embodiment, layer 410 is deposited as an epitaxial layer and is subsequently annealed to align the crystalline structure of layer 410 with the crystalline structure of layer 112. Also in the preferred embodiment, this anneal step is performed before layer 410 is implanted with different dopants. In an alternative embodiment, layer 410 is deposited with a polycrystalline structure. In this alternative embodiment, layer 410 is annealed to change the atomic structure of layer 410 from polycrystalline to crystalline.

Figure 5:
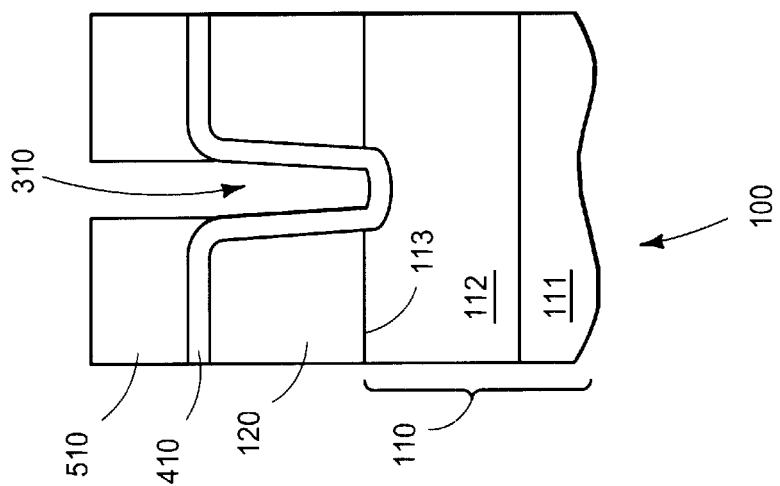

In FIG. 5, an implant mask 510 is formed over layer 410. As an example, mask 510 can be comprised of photoresist. Mask 510 exposes trench 310 and the portion of layer 410 located within trench 310. Mask 510 is used to define a portion of layer 410 that is to be converted from the second conductivity type to the first conductivity type.

In FIG. 6, layer 410 is illustrated to include a portion 416 that has been implanted with a dopant of the first conductivity type. Accordingly, portion 416 has the first conductivity type while other portions of layer 410 still have the second conductivity type. As an example, a first implant concentration of a first dopant can be implanted into portion 416 to convert portion 416 from the second conductivity type to the first conductivity type. In the preferred embodiment, the doping concentration of portion 416 is preferably substantially similar to the doping concentration of layer 112. Portion 416 of layer 410 is located at the bottom of trench 310. Portion 416 of layer 410 can be annealed to activate the implanted dopant in portion 416.

During the formation of portion 416, portions 417 of layer 410 located along the side walls of trench 310 are preferably prevented from being substantially implanted with the first dopant. Accordingly, the side walls of trench 310 are preferably substantially vertical with respect to surface 113 of substrate 110. Furthermore, the implantation angle of the first dopant is preferably substantially perpendicular to surface 113 of substrate 110. Portions 417 serve as the channel region for component 100.

Figure 7:
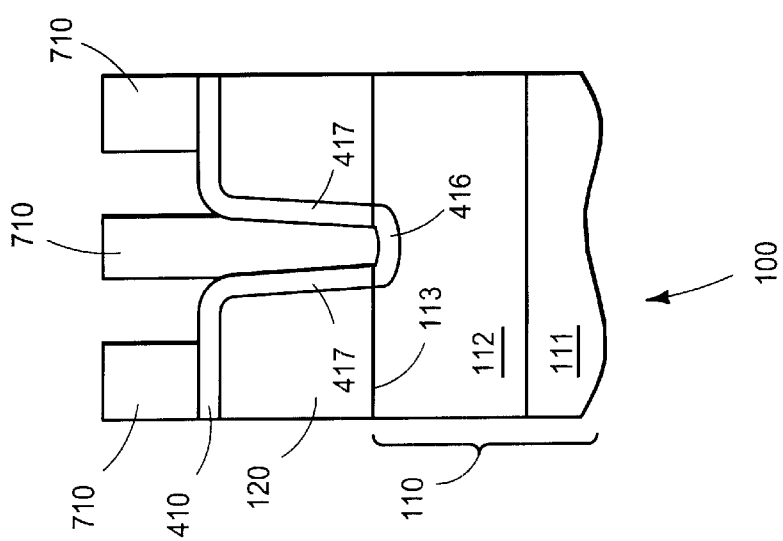

Turning to FIG. 7, an implant mask 710 is formed over layer 410. As an example, mask 710 can be comprised of photoresist. Mask 710 exposes portions of layer 410 and defines source regions within layer 410.

Figure 8:
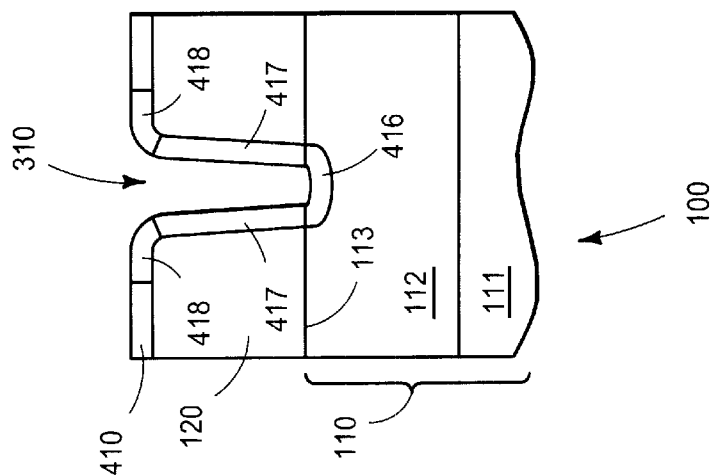

In FIG. 8, layer 410 is illustrated to include portions 418 that have been implanted with a dopant of the first conductivity type. Portions 418 serve as source regions for component 100. As an example, a second implant concentration of the first dopant can be implanted into layer 410 to form portions 418. The second implant concentration is greater than the first implant concentration used to form portion 416 in layer 410. However, the dopant species implanted into portions 418 is preferably the same as the dopant species implanted into portion 416 and the dopant species located in layers 112 and 111. Accordingly, portions 418 can have an N+ conductivity type, and portion 416 can have an N− conductivity type. Portions 418 of layer 410 can be annealed to activate the implant dopant in portions 418.

During the formation of portions 418, portions 417 are preferably prevented from being substantially implanted during the implantation of portions 418. Accordingly, portions 417 continue to have the second conductivity type while portions 418 is converted from the second conductivity type to the first conductivity type.

Figure 9:
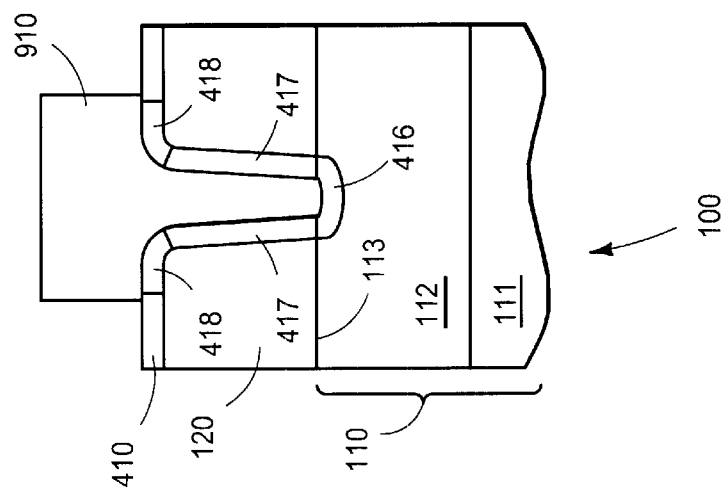

Turning to FIG. 9, an implantation mask 910 is formed over layer 410. As an example, mask 910 can be comprised of photoresist. Mask 910 exposes portions of layer 410 and defines isolation regions to be formed in layer 410.

Figure 10:
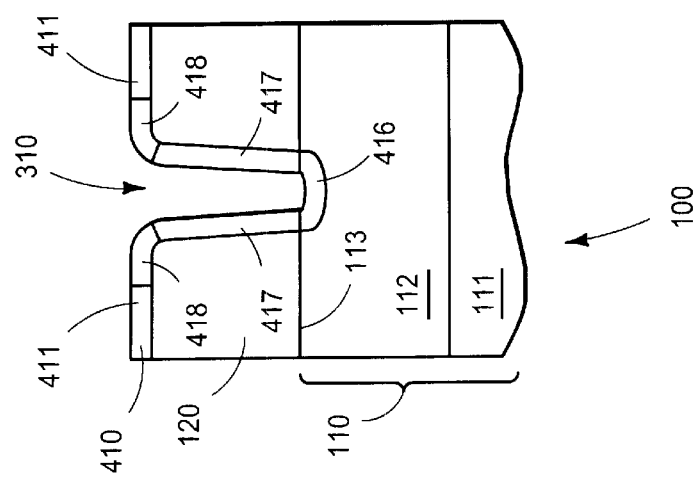

In FIG. 10, layer 410 is illustrated to include portions 411 that have been implanted with a third implant concentration of a second dopant. The third implant concentration is greater than the first implant concentration used to form portions 416 of layer 410. The second dopant used to form portions 411 of layer 410 increases the doping concentration of the second conductivity type in portions 411. Accordingly, portions 411 have a P+ conductivity type. Portions 411 are located outside of trench 310, adjacent to the rim of trench 310, and also adjacent to portions 418. Portions 411 of layer 410 can be annealed to activate the implanted dopant in portions 411. In a different embodiment, a single anneal can be used to simultaneously activate the dopants implanted into portions 416, 418, and 411 of layer 410.

Figure 11:
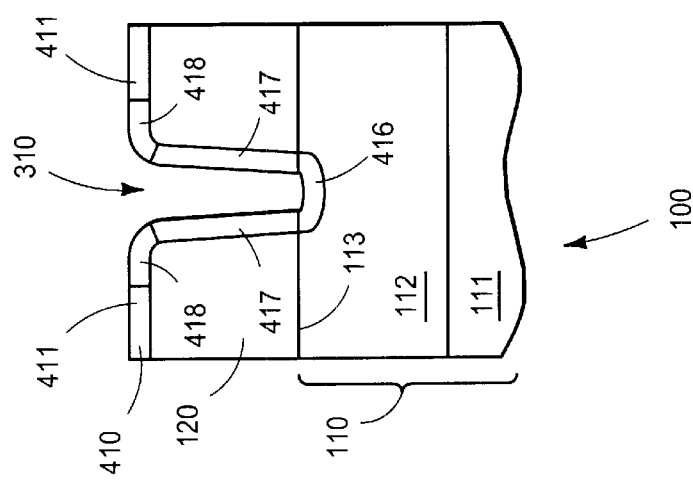

Turning to FIG. 11, layer 410 is oxidized, and the oxidation layer is removed. This sacrificial oxidation process cleans the surface of layer 410 to ensure a high-quality gate oxide that is subsequently formed over layer 410.

Figure 12:
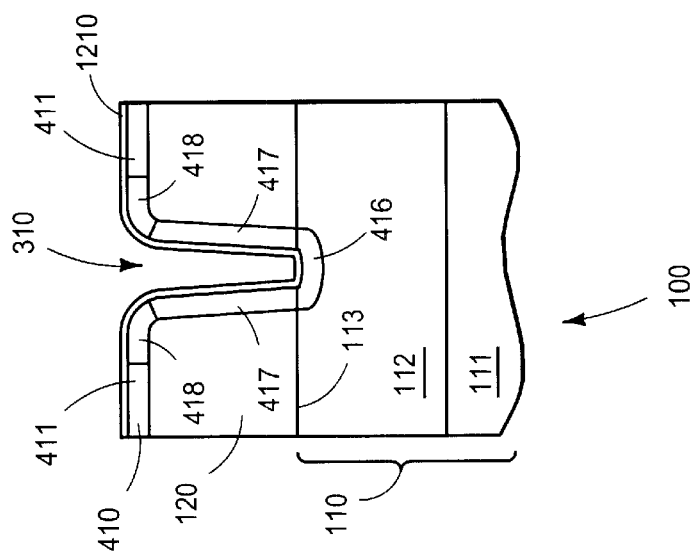

In FIG. 12, a third layer 1210 is disposed or formed over layer 410. In the preferred embodiment, layer 1210 is formed on layer 410. As an example, layer 1210 can have a thickness of approximately 3.5 to 25 nanometers. Layer 1210 serves as a gate oxide for component 100. Accordingly, layer 1210 is comprised of an electrically insulative material such as, for example, silicon dioxide, silicon nitride, or both. In the preferred embodiment, layer 1210 is thermally grown over layer 410 using an oxidation process. This oxidation process is preferably performed after the implantation steps used to form portions 416, 418, and 411 in layer 410. Layer 1210 does not need to be formed over the entire surface of layer 410, but can be formed only in and around trench 310.

Figure 13:
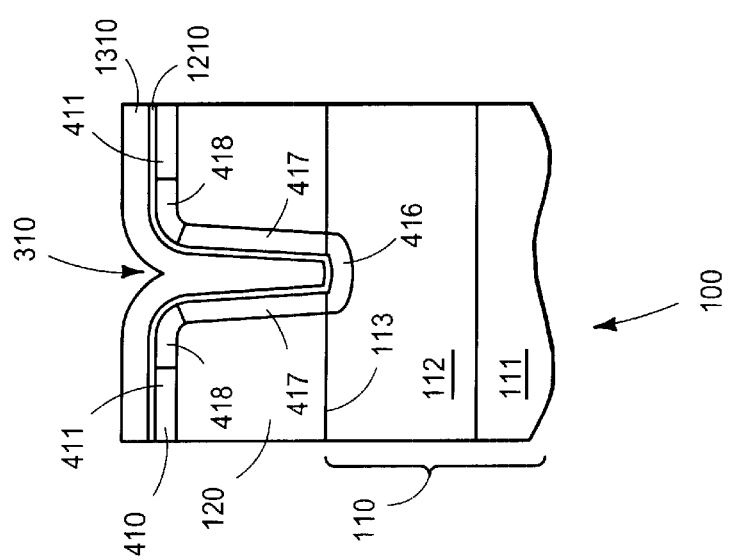

Then, an electrode is formed over layers 1210 and 410 in trench 310. Turning to FIG. 13, a fourth layer 1310 is disposed or deposited over layer 1210 and in trench 310. In the preferred embodiment, layer 1310 is formed on layer 1210, is comprised of a semiconductor material such as silicon, has a polycrystalline structure, and has a thickness of approximately 17.5 to 175 nanometers.

Figure 14:
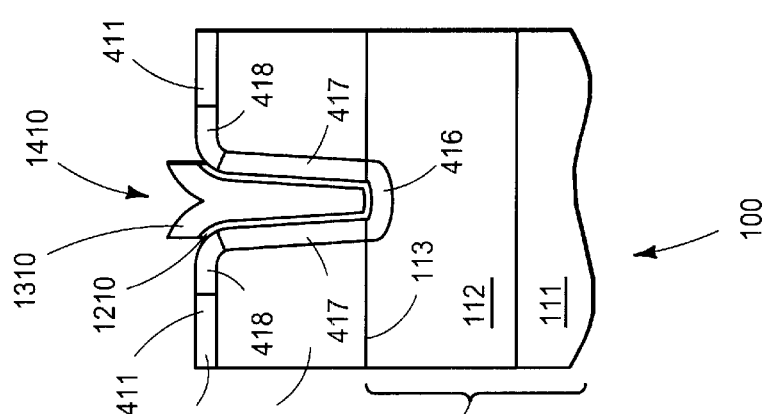

Next, turning to FIG. 14, layers 1310 and 1210 are etched. First, layer 1310 is etched to form or define a gate contact 1410 in layer 1310. Contact 1410 is located in trench 310. Next, layer 1210 is etched to expose a portion of the surface of layer 410.

Figure 15:
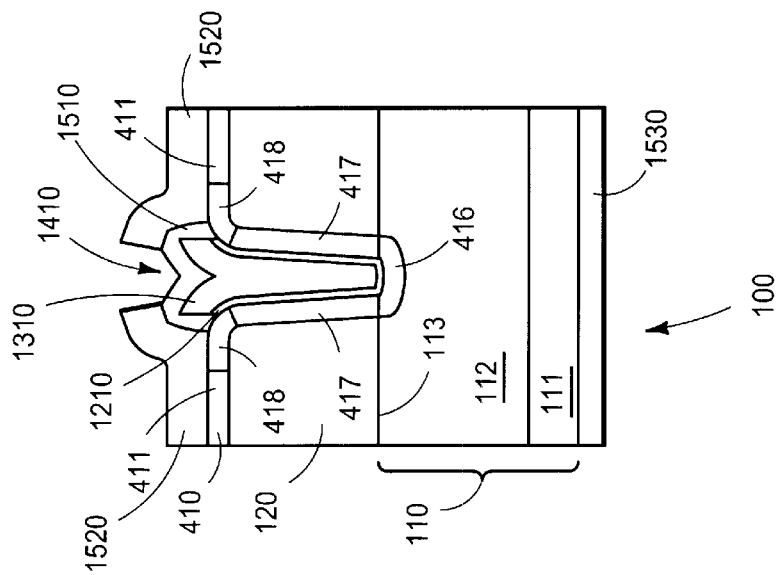

Subsequently, in FIG. 15, source contacts 1520 and a drain contact 1530 are formed. First, an electrically insulative layer 1510 is deposited and patterned over layer 410. The remaining portion of layer 1510 covers gate contact 1410 and exposes portions of portions 418 of layer 410. Next, source contacts 1520 are formed over layer 1510 and 410. Source contacts 1520 are coupled to portions 418 of layer 410. Next, support layer 111 is thinned to a thickness of approximately 50 to 350 micrometers. Then, a drain contact 1530 is formed adjacent to layer 111. Drain contact 1530 is coupled to layer 111.

The structure of component 100 has higher cell density than conventional planar power MOSFETs, trench power MOSFETs, and power V-MOSFETs. Component 100 can also have a low on resistance because of the high cell density of component 100. Furthermore, component 100 can have a submicron gate length with a large channel width. Component 100 can conduct high drain currents because of the large channel width and the short channel length of component 100.

The thin or shallow channel region of component 100 prevents the generation of an unnecessary depletion layer around the drain region. Therefore, component 100 can control the punch-through phenomenon between the source and drain regions of component 100. The source-drain punch-through can be controlled even at high drain voltage conditions.

Furthermore, the shallow or thin channel region surrounded by a thick silicon dioxide layer minimizes the parasitic capacitance beneath the gate contact. The minimization of the parasitic gate capacitance eliminates the need to charge and discharge the parasitic capacitance. Accordingly, component 100 can operate at high frequencies.

Moreover, the N− conductivity type of layer 112 and the N+ conductivity type of layer 111 prevents the formation of an unnecessary depletion layer in the channel region of component 100. Thus, component 100 can have high insulation voltage resistance.

Figure 16:
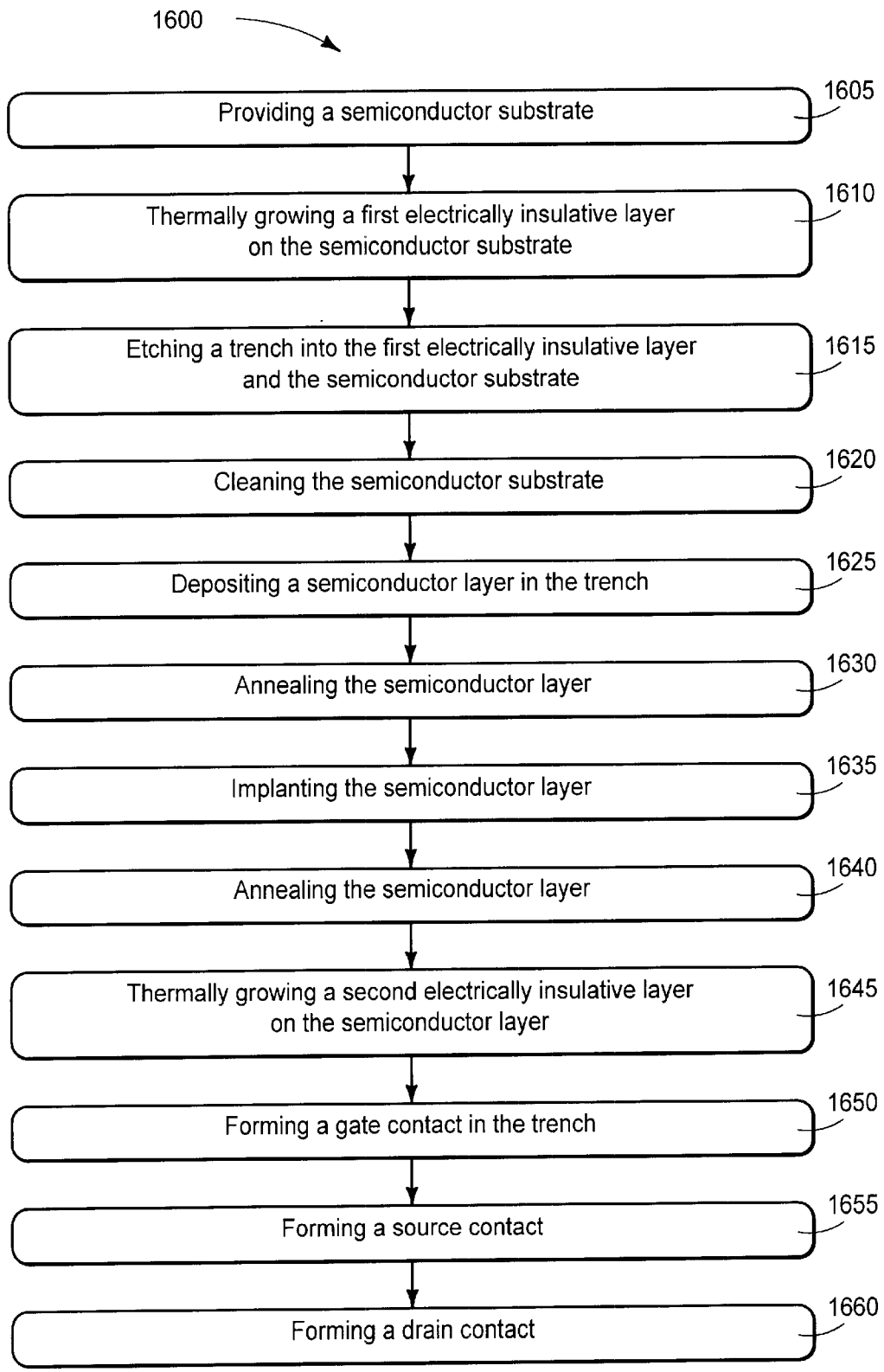
FIG. 16 outlines a method of manufacturing the semiconductor component of FIGS. 1 through 15 in accordance with an embodiment of the invention.

FIG. 16 outlines a method of manufacturing semiconductor component 100 that was previously described in detail with reference to FIGS. 1 through 15. At a step 1605 of method 1600, a semiconductor substrate is provided. At a step 1610 of method 1600, a first electrically insulative layer is thermally grown on the semiconductor substrate. At a step 1615, a trench is etched into the first electrically insulative layer and the semiconductor substrate, and at a step 1620, the etched portion of the semiconductor substrate is cleaned. At a step 1625, a semiconductor layer is deposited in the trench. Next, at a step 1630, the semiconductor layer is annealed, and then at a step 1635, the semiconductor layer is implanted. Subsequently, at a step 1640 of method 1600, the semiconductor layer is annealed again, and at a step 1645, a second electrically insulative layer is thermally grown on the semiconductor layer. Then, at a step 1650, a gate contact is formed in the trench, and at a step 1655, a source contact is formed. Next, at a step 1660 of method 1600, a drain contact is formed.

Therefore, an improved semiconductor component and method of manufacture is provided to overcome the disadvantages of the prior art. The semiconductor component described herein has high cell density, can control the punch-through phenomenon, has low on resistance, can operate at high frequencies, and can have a high insulation voltage resistance.

Although the invention has been described with reference to specific embodiments, it will be understood by those skilled in the art that various changes may be made without departing from the spirit or scope of the invention. For instance, the numerous details set forth herein such as, for example, the material compositions, the doping concentrations, and the layer thicknesses are provided to facilitate the understanding of the invention and are not provided to limit the scope of the invention. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A method of manufacturing a vertically insulated power Metal-Oxide-Semiconductor Field Effect Transistor (MOSFET) comprising:

providing a semiconductor substrate having a surface, wherein providing the semiconductor substrate further comprises:
    providing a support layer comprised of silicon and having an n-type conductivity and a first doping concentration, and
    providing an epitaxial layer located on the support layer, comprised of silicon, having the n-type conductivity, and having a second doping concentration less than the first doping concentration, the epitaxial layer forming the surface of the semiconductor substrate;
forming an electrically insulative layer over the surface of the semiconductor substrate, wherein forming the electrically insulative layer further comprises:
    thermally growing the electrically insulative layer on the epitaxial layer,
    providing the electrically insulative layer comprised of silicon dioxide,
    forming the electrically insulative layer on the surface of the semiconductor substrate, and
    providing the electrically insulative layer with a thickness of approximately 200 to 2,000 nanometers;
etching a trench into the electrically insulative layer;
etching the trench into the semiconductor substrate after etching the trench into the electrically insulative layer;
depositing a first semiconductor layer over the electrically insulative layer, over the surface of the semiconductor substrate, and into the trench, wherein depositing the first semiconductor layer further comprises:
    providing the first semiconductor layer comprised of silicon, having a p-type conductivity, and having a third doping concentration less than the first doping concentration,
    depositing the first semiconductor layer on the electrically insulative layer and on the epitaxial layer, and
    providing the first semiconductor layer with a thickness of approximately 20 to 250 nanometers;
implanting the first semiconductor layer to form a source region in the first semiconductor layer around a rim of the trench;
oxidizing the first semiconductor layer to form a gate oxide in the trench and around the rim of the trench, wherein oxidizing the first semiconductor layer further comprises:
    providing the gate oxide comprised of silicon dioxide,
    forming the gate oxide on the first semiconductor layer,
    providing the gate oxide with a thickness of approximately 3.5 to 25 nanometers; and
forming a gate contact in the trench and over the gate oxide.

2. The method of claim 1 further comprising:

cleaning the semiconductor substrate after etching the trench into the semiconductor substrate and before depositing the first semiconductor layer; and annealing the first semiconductor layer after depositing the first semiconductor layer and before oxidizing the first semiconductor layer.

3. The method of claim 1 further comprising:

annealing the first semiconductor layer after depositing the first semiconductor layer and before implanting the first semiconductor layer, wherein implanting the first semiconductor layer occurs after annealing the first semiconductor layer and before oxidizing the first semiconductor layer.

4. The method of claim 1 wherein:

providing the semiconductor substrate further comprises:
   providing a support layer; and
   providing an epitaxial layer overlying the support layer, etching the trench into the semiconductor substrate further comprises:
   etching the trench into the epitaxial layer; and the method further comprises using the electrically insulative layer as a self-aligned etch mask while etching the trench into the epitaxial layer; and preventing the trench from extending into the support layer.

5. The method of claim 1 wherein:

providing the semiconductor substrate further comprises:
   providing a support layer having a first conductivity type and a first doping concentration; and
   providing an epitaxial layer overlying the support layer, having the first conductivity type, and having a second doping concentration less than the first doping concentration;

implanting the first semiconductor layer to form the source region further comprises implanting a first implant concentration of a first dopant of the first conductivity type into a portion of the first semiconductor layer around a rim of the trench to form the source region around the rim of the trench; and the method further comprises:
   preventing the first semiconductor layer located at a side wall of the trench and at a bottom of the trench from being substantially implanted with the first dopant while implanting the first implant concentration of the first dopant;

implanting a second implant concentration of the first dopant into a portion of the first semiconductor layer located at the bottom of the trench, the second implant concentration less than the first implant concentration; and preventing the first semiconductor layer located at a side wall of the trench from being substantially implanted with the first dopant while implanting the second implant concentration of the first dopant.

6. The method of claim 5 further comprising:

implanting a third implant concentration of a second dopant into a portion of the first semiconductor layer located outside of the trench and adjacent to the rim of the trench, the third implant concentration greater than the second implant concentration.

7. The method of claim 1 wherein:

providing the semiconductor substrate further comprises:
   providing a support layer; and
   providing an epitaxial layer overlying the support layer;

forming the gate contact further comprises:
   depositing a second semiconductor layer over the gate oxide, over the first semiconductor layer, and into the trench; and
   etching the second semiconductor layer; and the method further comprises:
     forming a source contact adjacent to and coupled to the source region; and
     forming a drain contact adjacent to and coupled to the support layer.

\* \* \* \* \*